United States Patent
Benjaminson et al.

(10) Patent No.: US 12,488,967 B2
(45) Date of Patent: Dec. 2, 2025

(54) EXTREME UNIFORMITY HEATED SUBSTRATE SUPPORT ASSEMBLY

(71) Applicant: Applied Materials, Inc., Santa Clara, CA (US)

(72) Inventors: David Benjaminson, Campbell, CA (US); Vijay D. Parkhe, San Jose, CA (US); Onkara Swamy Kora Siddaramaiah, Santa Clara, CA (US); Kirby H. Floyd, San Jose, CA (US); Justin Wang, Santa Clara, CA (US); Mehmet Tugrul Samir, Mountain View, CA (US); Dmitry Lubomirsky, Cupertino, CA (US)

(73) Assignee: Applied Materials, Inc., Santa Clara, CA (US)

(*) Notice: Subject to any disclaimer, the term of this patent is extended or adjusted under 35 U.S.C. 154(b) by 1482 days.

(21) Appl. No.: 16/403,097

(22) Filed: May 3, 2019

(65) Prior Publication Data

US 2019/0371577 A1    Dec. 5, 2019

Related U.S. Application Data

(60) Provisional application No. 62/678,540, filed on May 31, 2018.

(51) Int. Cl.
*H01J 37/32*     (2006.01)
*H01L 21/67*     (2006.01)
(Continued)

(52) U.S. Cl.
CPC .. *H01J 37/32724* (2013.01); *H01L 21/67248* (2013.01); *H01L 21/6833* (2013.01);
(Continued)

(58) Field of Classification Search
CPC ........ H01J 2237/3341; H01J 37/32724; H01L 21/67248; H01L 21/6833; H01L 21/68735; H01L 21/68757
(Continued)

(56) References Cited

U.S. PATENT DOCUMENTS 5,730,801 A * 3/1998 Tepman ............ H01L 21/67751
                                                   156/345.31
5,801,915 A * 9/1998 Kholodenko ....... C23C 16/4586
                                                   279/128
(Continued)

FOREIGN PATENT DOCUMENTS

DE   102009046866 A1 *  5/2011   .......... B60L 11/1801
JP      H1041253 A       2/1998
(Continued)

OTHER PUBLICATIONS

International Search Report and Written Opinion for PCT/US2019/030741 dated Aug. 29, 2019.
(Continued)

*Primary Examiner* — Charlee J. C. Bennett
(74) *Attorney, Agent, or Firm* — Patterson + Sheridan, LLP

(57) ABSTRACT

Implementations described herein provide a substrate support assembly which enables temperature uniformity across a workpiece surface. In one embodiment, a substrate support assembly is provided that includes a body. The body made from ceramic. The body having a workpiece support surface and a mounting surface. The workpiece support surface and the bonding chuck body surface having a flatness of less than 10 microns. A first heater is disposed on the bottom surface outside the body. A bonding layer is disposed over the first heater, wherein the bonding layer is electrically insulating and a cooling base having a body made from a metal. The cooling body having an upper cooling body surface and a
(Continued)

lower cooling body surface wherein the upper cooling body surface is less than about 10 microns flat.

12 Claims, 6 Drawing Sheets

(51) Int. Cl.
*H01L 21/683* (2006.01)
*H01L 21/687* (2006.01)

(52) U.S. Cl.
CPC .. *H01L 21/68735* (2013.01); *H01L 21/68757* (2013.01); *H01J 2237/3341* (2013.01)

(58) Field of Classification Search
USPC .................................................. 156/345.51
See application file for complete search history.

(56) References Cited

U.S. PATENT DOCUMENTS

| | | | | |
|---|---|---|---|---|
| 6,133,557 | A * | 10/2000 | Kawanabe | ............... H05B 3/30 501/153 |
| 6,159,299 | A * | 12/2000 | Koai | ................. H01L 21/67017 118/728 |
| 8,971,009 | B2 | 3/2015 | Parkhe et al. | |
| 9,666,466 | B2 | 5/2017 | Parkhe et al. | |
| 10,008,404 | B2 | 6/2018 | Parkhe | |
| 2002/0158060 | A1 * | 10/2002 | Uchiyama | ............... H05B 3/265 219/444.1 |
| 2002/0179592 | A1 * | 12/2002 | Hiramatsu | ........ H01L 21/67103 219/466.1 |
| 2003/0051665 | A1 * | 3/2003 | Zhao | ................... C23C 16/5096 712/42 |
| 2003/0161088 | A1 | 8/2003 | Migita | |
| 2005/0253285 | A1 * | 11/2005 | Kuibira | ............. H01L 21/67103 257/787 |
| 2010/0304571 | A1 * | 12/2010 | Larson | .............. H01L 21/68757 156/60 |
| 2011/0157760 | A1 * | 6/2011 | Willwerth | ........... H01L 21/6833 361/234 |
| 2011/0229837 | A1 * | 9/2011 | Migita | ................ H01L 21/6831 156/60 |
| 2012/0091108 | A1 * | 4/2012 | Lin | ..................... H01L 21/6831 219/201 |
| 2012/0309115 | A1 | 12/2012 | Koelmel et al. | |
| 2013/0072024 | A1 | 3/2013 | Ricci et al. | |
| 2013/0088809 | A1 * | 4/2013 | Parkhe | ...................... F28F 3/00 165/185 |
| 2013/0340942 | A1 * | 12/2013 | Schaefer | ................ F16J 15/021 29/505 |
| 2014/0291311 | A1 * | 10/2014 | Cho | .................. H01L 21/67103 29/611 |
| 2014/0318711 | A1 * | 10/2014 | Wada | ................ H01L 21/67092 156/382 |
| 2015/0255258 | A1 | 9/2015 | Nozawa et al. | |
| 2016/0276196 | A1 | 9/2016 | Parkhe | |
| 2016/0276197 | A1 | 9/2016 | Kim et al. | |
| 2017/0110358 | A1 | 4/2017 | Sadjadi et al. | |
| 2017/0173934 | A1 | 6/2017 | Narendrnath et al. | |
| 2017/0215230 | A1 | 7/2017 | Parkhe | |
| 2017/0303338 | A1 * | 10/2017 | Parkhe | ................ C23C 16/4581 |
| 2018/0047604 | A1 * | 2/2018 | Takemoto | ........... H01L 21/6831 |
| 2018/0053678 | A1 | 2/2018 | Kugimoto | |
| 2018/0122680 | A1 * | 5/2018 | Yang | ................. H01J 37/32715 |

FOREIGN PATENT DOCUMENTS

| | | | |
|---|---|---|---|
| JP | 2001244059 A | | 9/2001 |
| JP | 2002175867 A | | 6/2002 |
| JP | 2003504871 A | | 2/2003 |
| JP | 2006287213 A | | 10/2006 |
| JP | 2008300491 A | | 12/2008 |
| JP | 200965153 A | | 3/2009 |
| JP | 201161049 A | | 3/2011 |
| JP | 2011222793 A | | 11/2011 |
| JP | 2013120835 A | | 6/2013 |
| JP | 2014216500 A | | 11/2014 |
| JP | 2015109139 A | * | 6/2015 |
| JP | 2016171185 A | | 9/2016 |
| JP | 2017152137 A | | 8/2017 |
| JP | 2017183329 A | | 10/2017 |
| JP | 2017208374 A | | 11/2017 |
| JP | 2018511934 A | | 4/2018 |
| KR | 100587191 B1 | | 6/2006 |
| KR | 10-2017-0128585 A | | 11/2017 |
| WO | 200104945 A1 | | 1/2001 |
| WO | 2014119637 A1 | | 8/2014 |

OTHER PUBLICATIONS

Office Action from Korean Patent Application No. 10202070133946 dated Feb. 23, 2022.
Office Action from Taiwan Patent Application No. 108117423 dated Jan. 31, 2020.
Office Action from Japan Patent Application No. 2020-565321 dated Jan. 24, 2023.
Office Action from Japan Patent Application No. 2021-179166 dated Apr. 25, 2023.
Office Action from Japan Patent Application No. 2021-179166 dated Dec. 19, 2023.
Office Action from Korean Patent Application No. 1020227041112 dated Jul. 27, 2023.
Office Action from Japan Patent Application No. 2020-565321 dated Oct. 10, 2023.
Office Action from Korean Patent Application No. 1020227041112 dated Feb. 25, 2024.
Office Action from Chinese Patent Application No. 201980030055.8 dated May 22, 2024.
Decision of Rejection and Nonacceptance of Amendments for Japanese Application No. 2020-565321 dated Jun. 25, 2024.
Decision of Rejection and Nonacceptance of Amendments for Japanese Application No. 2021-179166 dated Sep. 3, 2024.
Korean Office Action for Application No. 1020227041112 dated Oct. 2, 2024.
Office Action for Application No. 201980030055.8 dated Apr. 30, 2025.
Korean Office Action for Application No. 1020227041112 dated Mar. 26, 2025.

* cited by examiner

EXTREME UNIFORMITY HEATED SUBSTRATE SUPPORT ASSEMBLY

CROSS-REFERENCE TO RELATED APPLICATIONS

This application claims benefit of U.S. Provisional Application Ser. No. 62/678,540, filed May 31, 2018, of which is incorporated by reference in its entirety.

BACKGROUND

Field

Implementations described herein generally relate to semiconductor manufacturing and more particularly to temperature controlled substrate support assembly and method of using the same.

Description of the Related Art

As the feature size of the device patterns get smaller, the critical dimension (CD) requirements of these features become a more important criterion for stable and repeatable device performance. Allowable CD variation across a substrate processed within a processing chamber is difficult to achieve due to chamber asymmetries such as chamber and substrate temperature, flow conductance, and RF fields.

In processes utilizing an electrostatic chuck, uniformity of temperature control across the surface of the substrate is even more challenging due to the non-homogeneous construction of the chuck below the substrate. For example, some regions of the electrostatic chuck have gas holes, while other regions have lift pin holes that are laterally offset from the gas holes. Still other regions have chucking electrodes, while other regions have heater electrodes that are laterally offset from the chucking electrodes. Since the structure of the electrostatic chuck can vary both laterally and azimuthally, uniformity of heat transfer between the chuck and substrate is complicated and very difficult to obtain, resulting in local hot and cold spots across the chuck surface, which consequently result in non-uniformity of processing results along the surface of the substrate.

The lateral and azimuthal uniformity of heat transfer between the chuck and substrate is further complicated by heat transfer schemes commonly utilized in conventional substrate supports to which the electrostatic chuck is mounted. The non-uniformity creates particular problems controlling etch rates across the substrate. In particular, the non-uniformity of temperature across the substrate makes it difficult to control etching from center to edge of the substrate having selectivity when forming device patterns having small critical dimensions in the substrate.

Thus, there is a need for an improved substrate support assembly.

SUMMARY

Implementations described herein provide a substrate support assembly which enables temperature uniformity across a workpiece surface. In one embodiment, a substrate support assembly is provided that includes a body. The body made from ceramic. The body having a workpiece support surface and a mounting surface. The workpiece support surface and the bonding chuck body surface having a flatness of less than about 10 microns. At least a first heater is disposed on the bottom surface outside the body. A bonding layer is disposed over the first heater, wherein the bonding layer is electrically insulating and a cooling base having a body made from a metal. The cooling body having an upper cooling body surface and a lower cooling body surface wherein the upper cooling body surface has a flatness of less than about 10 microns.

In another example, a substrate support assembly is provided that includes an electrostatic chuck, at least a first heater, insulating layer and a shaft. The electrostatic chuck includes a chuck body made from ceramic. The chuck body has an embedded high voltage chucking electrode. The chuck body has a workpiece support surface and a bonding chuck body surface. The workpiece support surface and the bonding chuck body surface having a flatness of less than about 10 microns. The first heater is disposed on the bonding chuck body surface outside of the chuck body. The insulating layer is disposed over the first heater. The first heater has a portion trimmed to achieve a higher desired resistance than adjacent portions of the first heater so as to provide a desired temperature output. The ceramic shaft has leads connected to the chucking electrode embedded in the electrostatic chuck.

Other implementations described herein provide a processing chamber having a substrate support assembly which enables both lateral and azimuthal uniformity across a workpiece surface. The processing chamber has a chamber body having walls, a bottom and a lid which enclose an internal volume. A substrate support assembly is disposed in the internal volume. The substrate support assembly has an electrostatic chuck having a body made from ceramic. The body having a workpiece support surface and a mounting surface. The workpiece support surface and the bonding chuck body surface having a flatness of less than 10 microns. A plurality of heaters is disposed on the bottom surface outside the body wherein the heaters are arranged in multiple zones. A bonding layer is disposed over the plurality of heaters wherein the bonding layer is electrically insulating and a cooling base having a body made from a metal. The cooling body having an upper cooling body surface and a lower cooling body surface wherein the upper cooling body surface is less than about 10 microns flat.

In yet another embodiment, a method for controlling the temperature uniformity of a workpiece is provided. The method begins by providing power to a main resistive heater having four or more zones formed on a bottom surface of the ESC. The temperature is measured with a plurality of temperature sensors across the substrate. The temperature uniformity of the substrate is controlled to within 1 degrees Celsius across the substrate surface. The method includes selectively etching the substrate disposed on the substrate support assembly.

BRIEF DESCRIPTION OF THE DRAWINGS

So that the manner in which the above recited features of the present invention can be understood in detail, a more particular description of the invention, briefly summarized above, may be had by reference to implementations, some of which are illustrated in the appended drawings. It is to be noted, however, that the appended drawings illustrate only typical implementations of this invention and are therefore not to be considered limiting of its scope, for the invention may admit to other equally effective implementations.

To facilitate understanding, identical reference numerals have been used, where possible, to designate identical elements that are common to the figures. It is contemplated that elements disclosed in one implementation may be beneficially used in other implementations without specific recitation.

DETAILED DESCRIPTION

Implementations described herein provide a substrate support assembly which enables both lateral and azimuthal uniformity of the temperature of an electrostatic chuck comprising the substrate support assembly, which in turn, allows both lateral and azimuthal uniformity of the lateral temperature profile of a substrate processed on the substrate support assembly. Moreover, the substrate support assembly also enables selective etching. Although the substrate support assembly is described below in an etch processing chamber, the substrate support assembly may be utilized in other types of plasma processing chambers, such as physical vapor deposition chambers, chemical vapor deposition chambers, ion implantation chambers, among others, and other systems where azimuthal tuning of a lateral temperature profile is desirable.

In one or more embodiments, the substrate support assembly allows for the correction of critical dimension (CD) variation at the edge of the substrate during vacuum process, such as etching, deposition, implantation and the like, by allowing the substrate temperature to be utilized to compensate for chamber non-uniformities, such as temperature, flow conductance, electrical fields, plasma density and the like. Embodiments herein describe an electrostatic chuck (ESC) having ceramic components with an embedded electrode and one or more heater elements printed thereon. The ESC structure is bonded to an aluminum cooling base. This base is thermally isolated from the shaft and integration components. The temperature is measured with a plurality of temperature probes and the temperature of the substrate support assembly is controlled by a closed loop chamber temperature controller.

Figure 1:
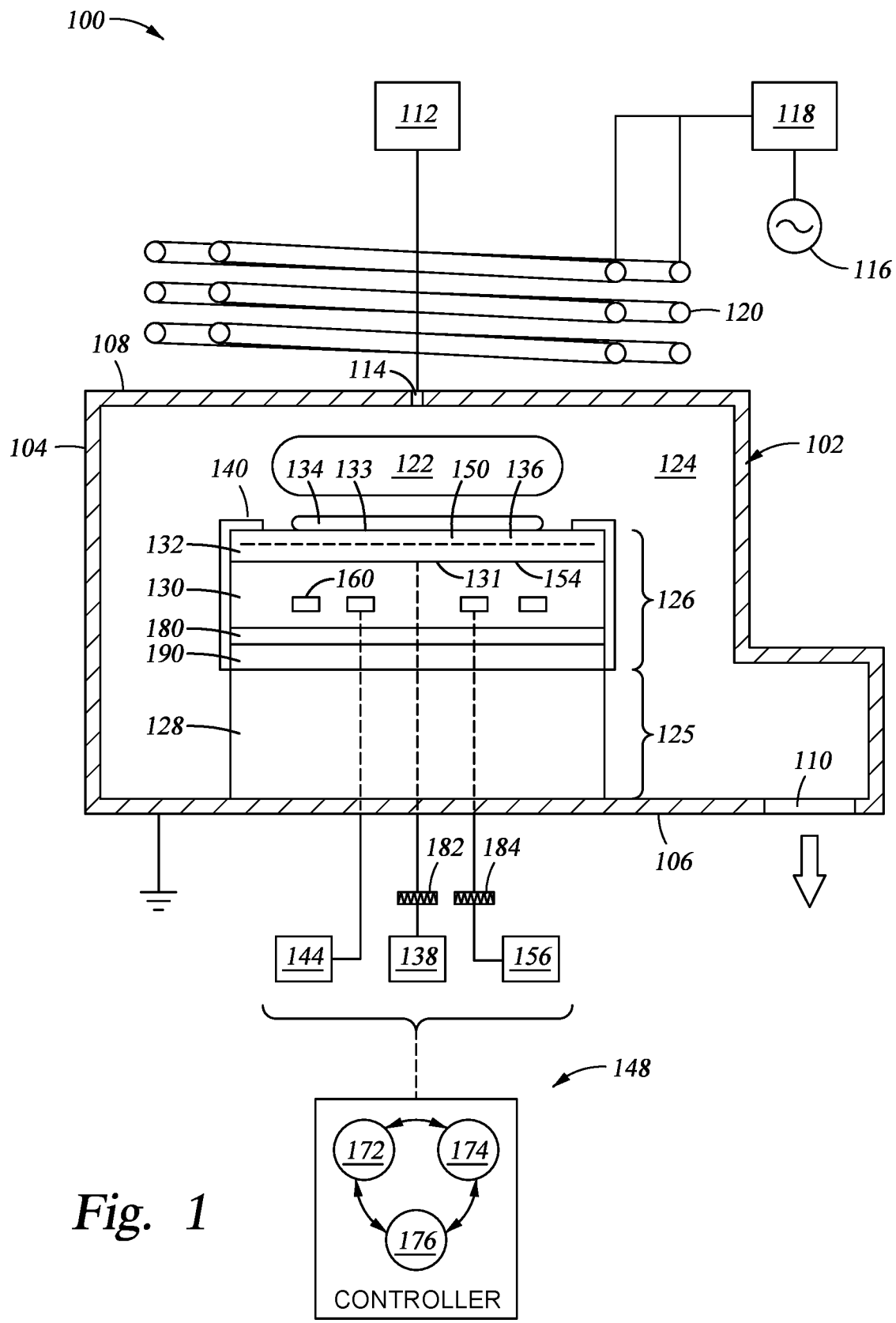
FIG. 1 is a cross-sectional schematic side view of a processing chamber having one embodiment of a substrate support assembly.

FIG. 1 is a cross-sectional schematic view of an exemplary etch processing chamber 100 having a substrate support assembly 126. The processing chamber may be an etch chamber, plasma treatment chamber, annealing chamber, physical vapor deposition chamber, chemical vapor deposition chamber, and ion implantation chamber, among others, as well as other processing systems where the ability to control a temperature profile of a substrate is desirable. Independent and local control of the temperature across discrete regions of the substrate support assembly 126 beneficially enables azimuthal tuning of the temperature profile, center to edge tuning of the temperature profile, and reduction of local temperature asperities, such as hot and cool spots for controlling plasma processing rates, such as an etch rate.

The processing chamber 100 includes a grounded chamber body 102. The chamber body 102 includes walls 104, a bottom 106 and a lid 108 which enclose an internal volume 124. The substrate support assembly 126 is disposed in the internal volume 124 and supports a substrate 134 thereon during processing.

The walls 104 of the processing chamber 100 include an opening (not shown) through which the substrate 134 is robotically transferred into and out of the internal volume 124. A pumping port 110 is formed in one of the walls 104 or the bottom 106 of the chamber body 102 and is fluidly connected to a pumping system (not shown). The pumping system is utilized to maintain a vacuum environment within the internal volume 124 of the processing chamber 100, while removing processing byproducts.

A gas panel 112 provides process and/or other gases to the internal volume 124 of the processing chamber 100 through one or more inlet ports 114 formed through at least one of the lid 108 or walls 104 of the chamber body 102. The process gas provided by the gas panel 112 are energized within the internal volume 124 to form a plasma 122 utilized to process the substrate 134 disposed on the substrate support assembly 126. The process gases are energized by RF power inductively coupled to the process gases from a plasma applicator 120 positioned outside the chamber body 102. In the embodiment depicted in FIG. 1, the plasma applicator 120 is a pair of coaxial coils coupled through a matching circuit 118 to an RF power source 116. In other embodiments, the plasma applicator 120 may be one or more of the chamber components, such as a showerhead assembly coupled through the matching circuit 118 to the RF power source 116.

A controller 148 is coupled to the processing chamber 100 to control operation of the processing chamber 100 and processing of the substrate 134. The controller 148 may be one of any form of general-purpose data processing system that can be used in an industrial setting for controlling the various sub-processors and sub-controllers. Generally, the controller 148 includes a central processing unit (CPU) 172 in communication with memory 174 and input/output (I/O) circuitry 176, among other common components. Software commands executed by the CPU of the controller 148, cause the processing chamber to, for example, introduce an etchant gas mixture (i.e., processing gas) into the internal volume 124, form the plasma 122 from the processing gas by application of RF power from the plasma applicator 120, and etch a layer of material on the substrate 134.

The substrate support assembly 126 is removably coupled to a support pedestal 125. The support pedestal 125, includes a pedestal base 128 mounted to the chamber body 102. The substrate support assembly 126 may be periodically removed from the support pedestal 125 to allow for refurbishment of one or more components of the substrate support assembly 126.

The substrate support assembly 126 generally includes at least a substrate support 132. The substrate support 132 may be a vacuum chuck, an electrostatic chuck, a susceptor, or other workpiece support surface. In the embodiment of FIG. 1, the substrate support 132 is an electrostatic chuck and will be described hereinafter as the electrostatic chuck (ESC) 132. The substrate support assembly 126 also includes a cooling base 130. The substrate support assembly 126 additionally includes a thermal isolator 180 and a base plate 190. The electrostatic chuck 132, cooling base 130, thermal isolator 180 and base plate 190 are circumscribed by an edge ring 140.

In one embodiment, the edge ring 140 is formed from a silicon based material. The edge ring forms a gap (not shown) provided for purge gas delivery between the edge ring 140 and the electrostatic chuck 132. An additional space (not shown) is provided between the edge ring 140 and the substrate 134 such that the edge ring 140 is configured to provide a purge gas delivered underneath the substrate 134. The edge ring 140 purge gas is directed away from the center of the substrate 134 towards the exhaust such that no deposition occurs on the edge ring 140 at the extreme edge of the substrate 134. Unlike conventional ESC's which have porous plugs and limited flow for a purge gas, the gap and additional space provides a large conductance purge gas channel which communicates up below the substrate 134 allowing for high flow (up to 15 slm) of flow through 16 holes when the substrate 134 is annealed on pins. The purge gas additionally comes from holes disposed in the electrostatic chuck 132. The substrate 134 is lifted on pins, and then the backside flow keeps the electrostatic chuck 132 clean from any by-product condensing on the surface.

The base plate 190 is configured to accommodate a plurality of driving mechanisms configured to raise and lower a plurality of lifting pins. Additionally, the base plate 190 is configured to accommodate the plurality of fluid connections from the electrostatic chuck 132 and the cooling base 130. The base plate 190 is also configured to accommodate the plurality of electrical connections from the electrostatic chuck 132. The myriad of connections may run externally or internally of the substrate support assembly 126 while the base plate 190 provides an interface for the connections to a respective terminus. The base plate 190 may be formed from any metal.

The thermal isolator 180 is disposed between the base plate 190 and the cooling base 130. The thermal isolator 180 is formed from a thermally insulating material having chemical and physical stability, such as a cross linked polystyrene, polyether ether ketone, alumina ($Al_2O_3$) or other suitable material.

The cooling base 130 is disposed between the thermal isolator 180 and the electrostatic chuck 132. The cooling base 130 is coupled to a heat transfer fluid source 144. The heat transfer fluid source 144 provides a non-electrically conductive heat transfer fluid which is circulated through one or more conduits 160 disposed in the cooling base 130. The fluid flowing through neighboring conduits 160 are isolated to enabling local control of the heat transfer between the electrostatic chuck 132 and different regions of the cooling base 130, which assists in controlling the lateral temperature profile of the substrate 134.

A fluid distributor is fluidly coupled between an outlet of the heat transfer fluid source 144 and the temperature controlled cooling base 130. The fluid distributor operates to control the amount of heat transfer fluid provided to the conduits 160. The fluid distributor is disposed outside of the processing chamber 100, within the substrate support assembly 126, within the pedestal base 128 or other suitable location.

The electrostatic chuck 132 has a mounting surface 131 and a workpiece surface 133 opposite the mounting surface 131. The electrostatic chuck 132 generally includes a chucking electrode 136 and one or more main resistive heaters 154 embedded in a dielectric body 150. The dielectric body 150 is fabricated from a ceramic material, such as $Y_2O_3$, $Er_2O_3$, AlN or $Al_2O_3$. Alternately, the dielectric body 150 is fabricated from one or more polymer layers, such as polyimide, polyetheretherketone, polyaryletherketone, and the like.

The chucking electrode 136 is configured as a mono polar or bipolar electrode, or other suitable arrangement. The chucking electrode 136 is coupled through an RF filter 182 to a chucking power source 138 which provides a RF or DC power to electrostatically secure the substrate 134 to the workpiece surface 133 of the dielectric body 150. The RF filter 182 prevents RF power utilized to form a plasma 122 within the processing chamber 100 from damaging electrical equipment or presenting an electrical hazard outside the processing chamber 100.

The workpiece surface 133 of the electrostatic chuck 132 may include gas passages (not shown) for providing backside heat transfer gas to the interstitial space defined between the substrate 134 and the workpiece surface 133 of the electrostatic chuck 132. The electrostatic chuck 132 also includes lift pin holes for accommodating lift pins (both not shown) for elevating the substrate 134 above the workpiece surface 133 of the electrostatic chuck 132 to facilitate robotic transfer into and out of the processing chamber 100. This enables low pressure chucking and positive pressure backside control for the substrate disposed therein the workpiece surface 133.

The electrostatic chuck 132 additionally has one or more main resistive heaters 154 disposed on the mounting surface 131. For example, the main resistive heaters 154 are provided with a polymer sheet attached thereto or printed directly on the mounting surface 131, i.e., between the dielectric body 150 and the cooling base 130. The main resistive heaters 154 are provided to elevate the temperature of the substrate support assembly 126 to a temperature for conducting chamber processes. The main resistive heaters 154 are configured to adjust the temperature of the electrostatic chuck 132 in a plurality of laterally separated heating zones defined by the main resistive heaters 154. The main resistive heaters 154 are coupled through an RF filter 184 to a main heater power source 156. The main heater power source 156 provides power to the main resistive heaters 154. The controller 148 controls the operation of the main heater power source 156, which is generally set to heat the substrate 134 to about a predefined temperature.

In one embodiment, a single main resistive heater 154 is utilized to create a single heating zone. In other embodiments, a plurality of main resistive heaters 154 are utilized to create a plurality of laterally separated heating zones, wherein the controller 148 enables one zone of the main resistive heaters 154 to be preferentially heated relative to the main resistive heaters 154 located in one or more of the other zones. For example, the main resistive heaters 154 are arranged concentrically in a plurality of four separated concentric heating zones.

The electrostatic chuck 132 includes one or more temperature sensors (not shown for providing temperature feedback information to the controller 148 for controlling the power applied by the main heater power source 156 to the main resistive heaters 154. The controller 148 may also control the operation of the cooling base 130. The temperature of the surface for the substrate 134 in the processing chamber 100 is influenced by the evacuation of the process gasses by the pump, the slit valve door, the plasma 122 and other factors. The cooling base 130 and the main resistive heaters 154 all help to control the surface temperature of the substrate 134.

Figure 2:
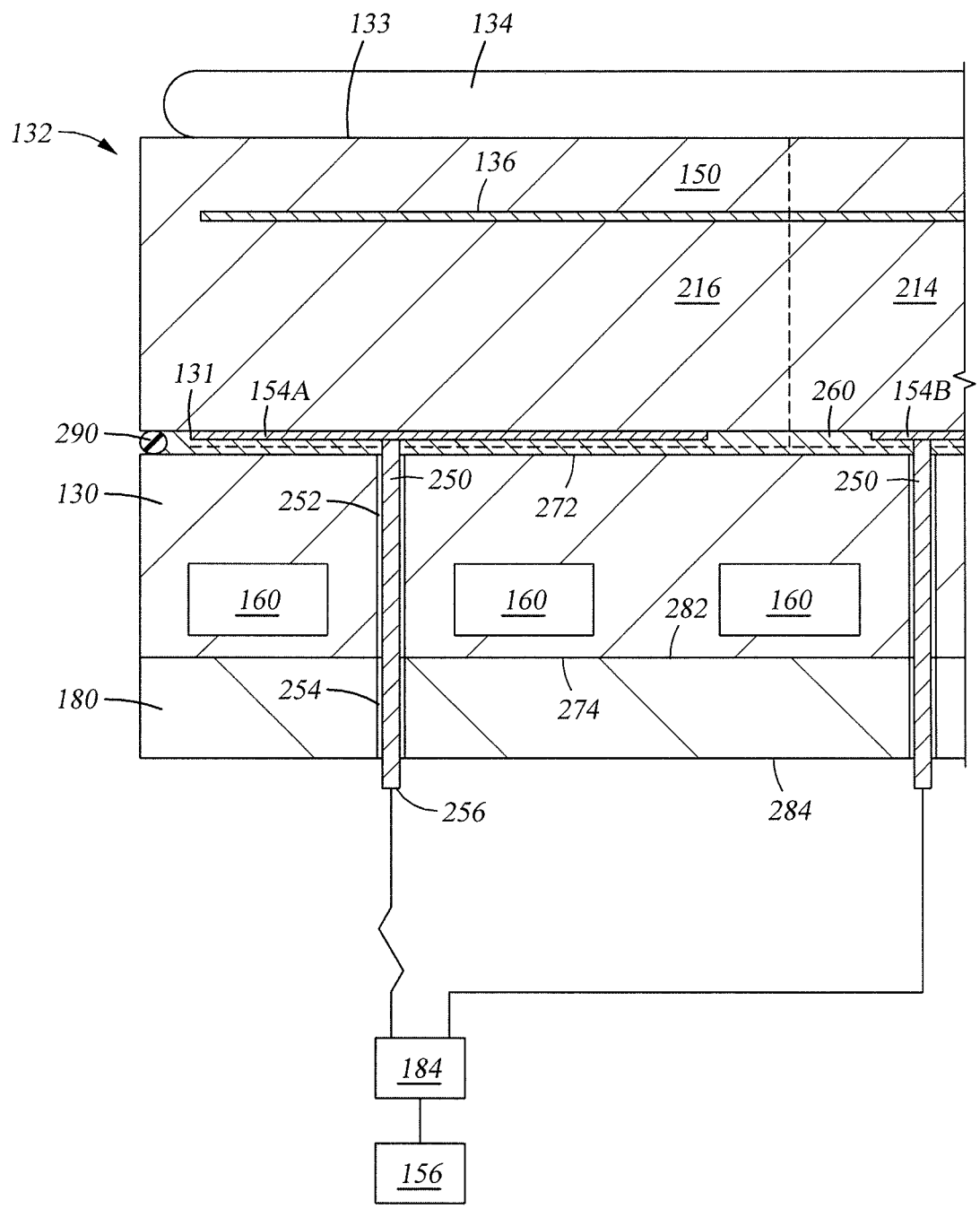
FIG. 2 is a partial cross-sectional schematic side view detailing portions of the substrate support assembly.

FIG. 2 is a partial cross-sectional schematic view illustrating portions of the substrate support assembly 126. Included in FIG. 2 are portions of the electrostatic chuck (ESC) 132, a bond layer 260, the cooling base 130, and the thermal isolator 180. The ESC 132 is configured for four zone, or more, temperature control with a uniformity between the zones of between about 0.3° Celsius and about 0.7° Celsius. The ESC 132 is capable of operating at temperatures between about negative 20° Celsius and less than positive 200° Celsius for low temperature processes, and at temperatures greater than about positive 200° Celsius for high temperature processes. For example, the ESC 132 is capable of operating at temperatures such as between about −20° Celsius and about 150° Celsius.

The mounting surface 131 and the workpiece surface 133 are disposed opposite sides of the body 150 of the ESC 132 and separated by about 2 mm to about 7 mm. The mounting surface 131 has a flatness between about 1 microns and about 10 microns, such as about 2 microns. The mounting surface 131 is substantially planar to the workpiece surface 133. The workpiece surface 133 has a flatness between about 1 microns and about 10 microns. The body 150 is formed from a ceramic material such as alumina or other suitable material.

The main resistive heaters 154 are disposed outside the body 150 and on the mounting surface 131. The main resistive heaters 154 are arranged in concentric zones about a center of the ESC 132 wherein the heaters in a first zone (not shown) are positioned along a first radius, the heaters in a second zone (not shown) are positioned along a second radius greater than the first radius, the main resistive heaters 154B in a third zone 214 are positioned along a third radius greater than the second radius, and the outer main heaters 154A in a fourth zone 216 are positioned along a fourth radius greater than the third radius. The main resistive heaters 154 are formed on the mounting surface 131 by plating, ink jet printing, screen printing, physical vapor deposition, stamping, wire mesh, pattern polyimide flex circuit, or by other suitable manner. For example, the main resistive heaters 154 are printed to the mounting surface 131 of the body 150. In other examples, the main resistive heaters 154 can be deposited on the mounting surface 131 by physical vapor deposition, chemical vapor deposition, applied as a prefabricated sheet, or by other suitable methods.

The main resistive heaters 154 are resistor formed from a film of nichrome, rhenium, tungsten, tantalum or other suitable materials. The resistor has an electrical resistivity ($\rho$) wherein a low $\rho$ indicates a material that readily allows the movement of an electric charge across the heater resistor. The resistance (R) is dependent on the $\rho$ times the length (l) over the cross sectional area (A) of the wire, or simply $R=\rho \cdot l/A$. Platinum has a $\rho$ of about $1.06 \times 10^{-7}$ ($\Omega \cdot m$) at 20° C. Tungsten has a $\rho$ of about $6.60 \times 10^{-8}$ ($\Omega \cdot m$) at 20° C. Nichrome has a $\rho$ of about $1.1 \times 10^{-8}$ to about $1.5 \times 10^{-8}$ ($\Omega \cdot m$) at 20° C. Thus, the resistance, and heat output, of the individual heaters, may be altered by either changing the length or the cross-sectional area of the wire.

Figure 4:
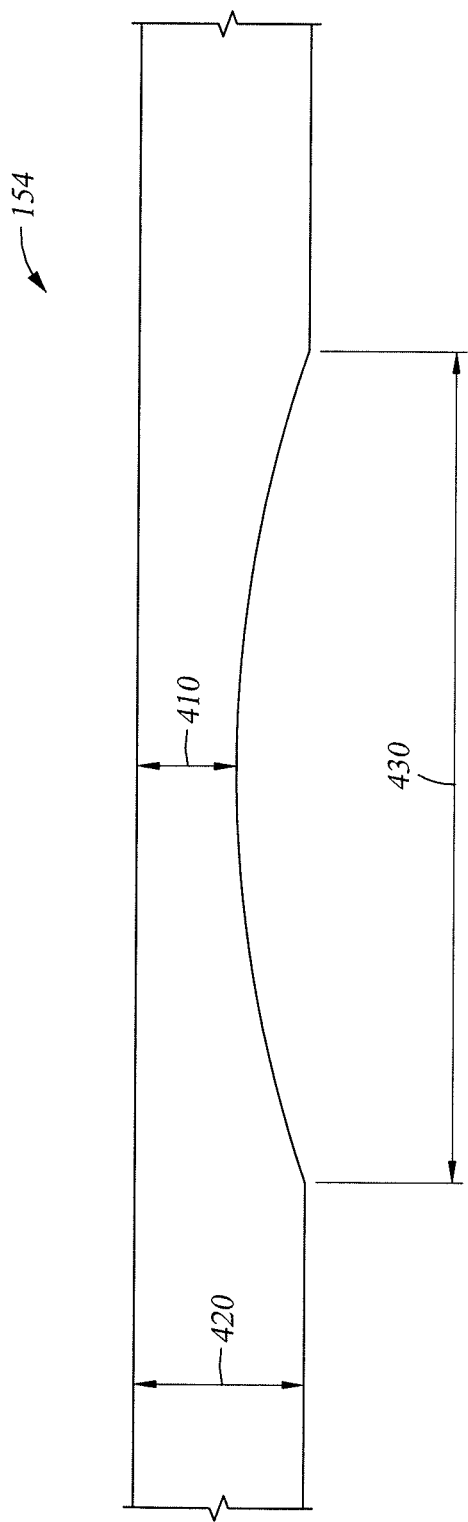
FIG. 4 is a schematic bottom view detailing a trimmed main resistive heater of the substrate support assembly.

Briefly turning additionally to FIG. 4, the main resistive heaters 154 have a film thickness 420, or a wire thickness, configured to efficiently provide heat when a current is passed along the wire of the main resistive heaters 154. A decrease in the film thickness 420 for the heaters result in an increase in the resistance R of the main resistive heaters 154 and a greater heat output therefrom. For example, the film thickness 420 is selected or modified for the main resistive heaters 154 to a reduced film thickness 410 to control the heat generated therein a portion 430 of the main resistive heater 154 after the main resistive heater 154 has been disposed on the mounting surface 131. In this manner, the main resistive heaters 154 in each zone can be fine-tuned to provide a desired temperature uniformity across the workpiece surface 133 of the ESC 132.

The resistance of one or more of the main resistive heaters 154 disposed on the mounting surface 131 of the ESC 132 are adjusted. The main resistive heaters 154 may be tested and further adjusted to more precisely meet a desired temperature profile control criteria.

The bond layer 260 is an electrically insulating layer. The bond layer 260 adheres the ESC 132 to the cooling base 130. The bond layer 260 is applied on the main resistive heaters 154 and electrically insulates the main resistive heater 154 to prevent contact with the cooling base 130 and shorting of the main resistive heaters 154. The bond layer 260 is an adhesive, such as an acrylic-based adhesive, an epoxy, a silicone based adhesive, a neoprene-based adhesive or other suitable adhesive. The bond layer 260 has a coefficient of thermal conductivity selected in a range from 0.1 to 160 W/mK. The adhesive materials comprising the bond layer 260 additionally can include at least one thermally conductive filler such as aluminum oxide ($Al_2O_3$), aluminum nitride (AlN), and titanium diboride ($TiB_2$), and the like.

In one embodiment, the bond layer 260 has a thickness of between about 0.3 mm and about 2.0 mm, such as about 1.0 mm and a thermal conductivity of between about 1.0 W/m-K and about 3.0 W/m-K, such as about 1.0 W/m-K. As the thickness of the bond layer 260 increases, the power to the main resistive heaters 154 decreases. Additionally, variation in the thickness of the bond layer 260 may be controlled to precisely set the gap between the ESC 132 and the cooling base 130. The low thickness variation of the bond layer 260 enhances the uniformity of the heat transfer rate between the ESC 132 and the cooling base 130 through the bond layer 260, thus improving the ability to maintain a desired temperature profile across the workpiece surface 133 of the body 150 of the ESC 132, and advantageously, the substrate disposed thereon during processing.

In the embodiment depicted in FIG. 2, a seal 290, such as an o-ring, is disposed between the ESC 132 and the cooling base 130. The seal 290 circumscribes and isolates the bond layer 260 from the processing region of the processing chamber, thus extending the service life of the bond layer 260 while preventing eroded bond material from becoming a process contaminant.

The cooling base 130 has a body 230 having a top surface 272 and a bottom surface 274. The body 230 is formed from a metal material such as an aluminum alloy. The top surface 272 and the bottom surface 274 define the opposite sides of the body 230 and are about 10 mm to about 32 mm apart. The top surface 272 is substantially planar to the bottom surface 274. The top surface 272 has a flatness of less than about 10 microns, such as about 1 micron or about 2 microns. The bottom surface 274 has a flatness of less than about 10 microns. The top surface 272 of the cooling base 130 is in contact with the bond layer 260. The cooling base 130 circulates a cooling fluid, such as a perfluoropolyether fluorinated (PFPE) fluid or water, suitable for maintaining temperatures in the cooling base 130 between about 90° Celsius and about negative 20° Celsius with effective exchange coefficient of between about 1000 $W/m^{2-}K$ and about 1400 $W/m^{2-}K$.

The bottom surface 274 is in contact with an upper surface 282 of the thermal isolator 180. The thermal isolator 180 additionally has a lower surface 284 opposite the upper surface 282. The upper surface 282 has a flatness of less than about 10 microns.

The flatness for each of the ESC 132, cooling base 130 and thermal isolator 180 facilitates an assembly having a bond thickness variation therebetween each of the ESC 132, cooling base 130 and thermal isolator 180 of less than 20 microns, such as about 1 micron. Such a gap is achieved while maintaining the surfaces of the ESC 132, cooling base 130 and thermal isolator 180 substantially parallel to each other. The substrate support assembly 126 synergistically enables greater temperature uniformity across a temperature control range between about negative 20° Celsius and about 150° Celsius. The temperature uniformity of the substrate support assembly 126 across the workpiece surface 133 can be maintained within less than 1° Celsius. The temperature uniformity advantageously enables selective etching of the substrate.

A terminal 250 is connected to at least the outer main heater 154A for coupling the main resistive heater 154 to the main heater power source 156. The terminal 250 is connected the outer main heater 154A by brazing, soldering or other suitable method. The terminal 250 extends in a direction generally perpendicular to the bottom surface 274 of the cooling base 130 through a passage 252 formed in the cooling base 130. The terminal 250 extends in a direction generally perpendicular to the bottom surface 274 of the cooling base 130. The location of the terminal 250 directly below the outer main heaters 154A frees space at the center of the ESC 132 for gas passages and electrical connections to the chucking electrode 136. The thermal isolator 180 also includes a passage 254 to allow the terminal 250 to extend through the thermal isolator 180 to facilitate electrical connections. The other main resistive heaters 154 may also have terminals 250 coupled thereto in a similar manner.

Figure 3:
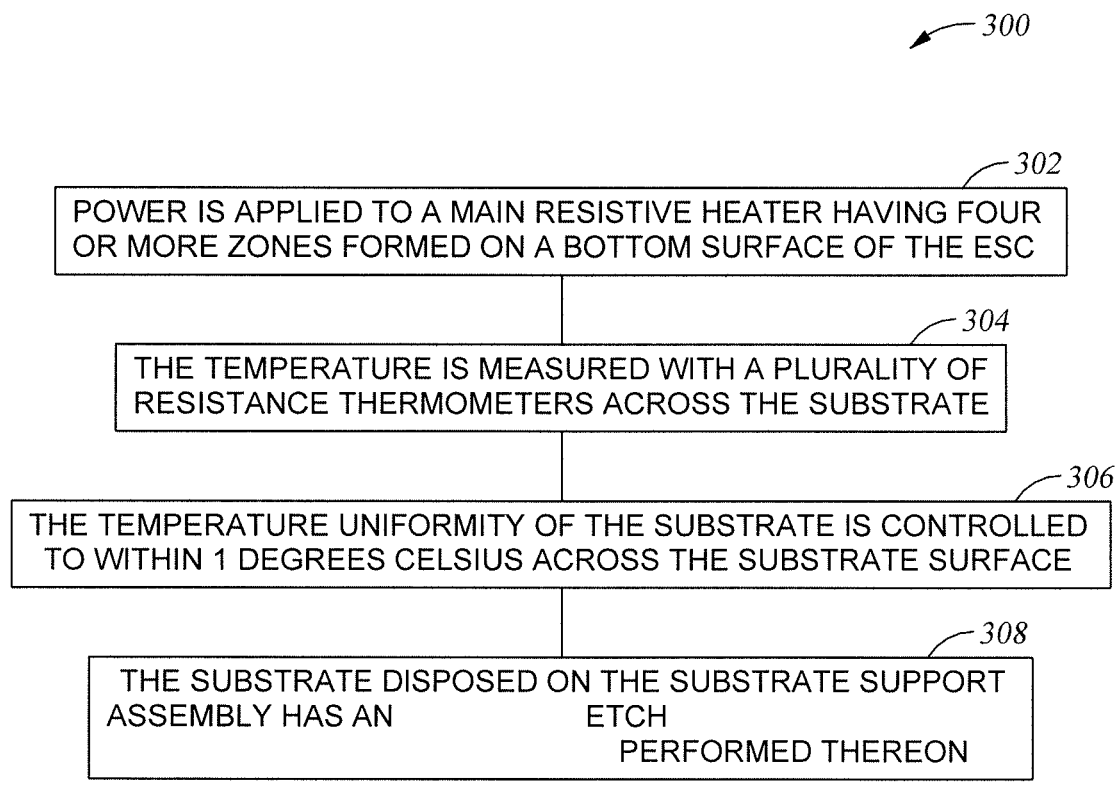
FIG. 3 is a flow diagram for one embodiment of a method 300 for processing a substrate utilizing a substrate support assembly, such as the substrate support assembly described above, among others.

FIG. 3 is a flow diagram for one embodiment of a method 300 for processing a substrate utilizing a substrate support assembly, such as the substrate support assembly 126 described above, among others. The method 300 begins at block 302 where power is applied to a main resistive heater having four or more zones formed on a bottom surface of the ESC. The electrostatic chuck (ESC) having ceramic components with an embedded electrode and four or more independent heater elements printed on the underside as described above. The main resistive heater is segmented into zones which are independently controllable to enable both lateral and azimuthal tuning of the lateral temperature profile of a substrate processed on the substrate support assembly. Furthermore, the main resistive heater in each segmented zone has material selectively removed to fine tune the local resistance and temperature output. Thus, enabling realization of a uniform temperature across the substrate of less than 1° Celsius.

At block 304, the temperature is measured with a plurality of resistance thermometers across the substrate. In one embodiment, the temperature is measures with resistance temperature detectors (RTDs).

At block 306, the temperature uniformity of the substrate is controlled to within 1 degree Celsius across the substrate surface. The thermometers provide real-time temperature information for the substrate to a closed loop chamber temperature controller for controlling the heaters and maintaining temperature uniformity across the substrate.

At block 308, the substrate disposed on the substrate support assembly is etched. The substrate has an etch layer exposed thereon. In one embodiment, the etch layer may be a dielectric material such as silicon containing materials, for example, SiO2, SiN, SiON, SiC, SiOC, SiOCN, SiCN, a-Si. In another embodiment, the etch layer may be a metal dielectric material, such as AlN, HfO2, AlO3, WN, NiSi, etc. In yet another embodiment, the etch layer may be a metal material such as Cu, Al, W, Ni, Co, etc. In each of the embodiments, the etch layer is etch selectively to other materials or layers on the substrate.

Figure 5:
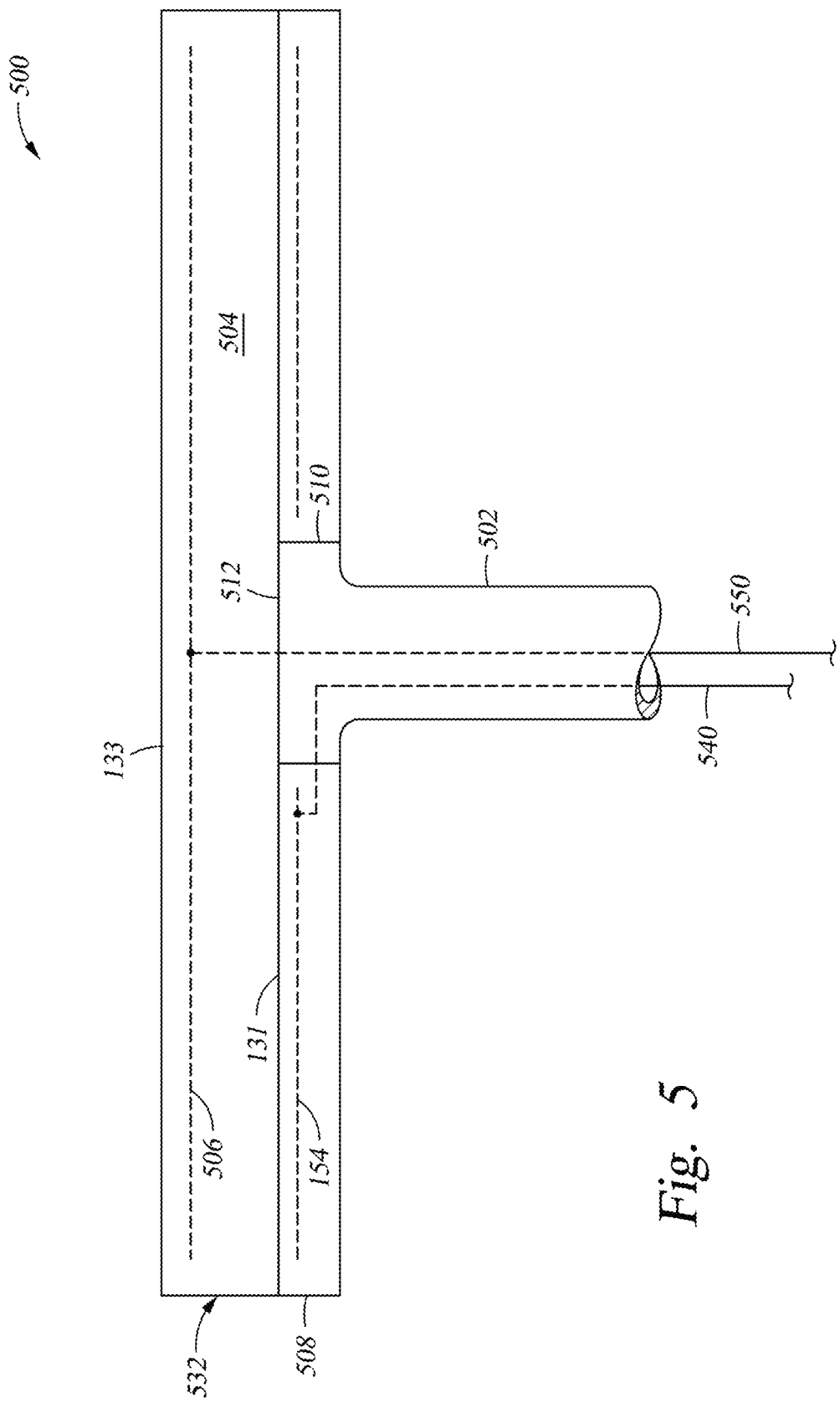
FIG. 5 is a partial cross-sectional schematic side view of another example of a substrate support assembly.

FIG. 5 is a partial cross-sectional schematic side view of another example of a substrate support assembly 500. The substrate support assembly 500 includes an electrostatic chuck 532 coupled to a shaft 502. The shaft 502 may be formed from a ceramic material, such as AlN, or other suitable material.

The electrostatic chuck 532 is generally fabricated as discussed above with reference to the electrostatic chuck 132. The electrostatic chuck 532 includes a ceramic body 504 having an embedded high-voltage chucking electrode 506. The chucking electrode 506 is disposed close to the workpiece surface 133. One or more main resistive heaters 154 are disposed on the mounting surface 131 of the ceramic body 504. The one or more main resistive heaters 154 may be trimmed as discussed above to tune the resistance, and thus heat output, of the one or more main resistive heaters 154. In some instances, the main resistive heaters 154 may be trimmed after the shaft 502 is coupled to the ceramic body 504.

The center of the ceramic body 504 is prepared to facilitate making electric connections after coupling of the body 504 to the shaft 502. For example, the center of the ceramic body 504 may be prepared by machining the body 504 after firing. The main resistive heaters 154 may be applied, for example by screen printing or a film, either prior to or after the center of the shaft 502 is machined to facilitate electrical connection of leads 540, 550 to the electrode 506 and main resistive heaters 154.

After trimming the main resistive heaters 154, an insulating coating 508 is disposed over the main resistive heaters 154. The insulating coating 508 may be a layer of ceramic, such as AlN, ceramic or other insulating tape, such as green tape or glass tape. Green tape is an un-fired ceramic tape, for example AlN tape. In one example wherein the insulating coating 508 is glass tape, the glass includes one or more elements selected from the group consisting of Al, N, O and Y. The insulating coating 508 may include a hole 510 to allow an end 512 of the shaft 502 to be coupled directly to the mounting surface 131 of the ceramic body 504. The end 512 of the shaft 502 may be bonded by diffusion, high temperature glue, brazed or coupled in another suitable manner directly to the mounting surface 131 of the ceramic body 504.

The insulating coating 508 may alternately be replaced with a coating having one or more of alumina (Al2O3), silica (SiO2), magnesium oxide (MgO), yttria (Y2O3), (i.e., ASMY) in the coating. The insulating coating 508, or ASMY coating, is plasma spray coated onto the main resistive heaters 154 to a thickness of about 300 µm. It should be appreciated that other techniques are equally suitable to apply the ASMY coating to the main resistive heaters 154. The insulating coating 508 and ceramic body 504 may be heat treated. The insulating coating 508 of ASMY is heat treated to produce a dielectric breakdown of about 4 KV in the insulating coating 508.

In one example, a fabrication sequence for fabricating the substrate support assembly 500 includes sintering an AlN ceramic body with embedded high voltage chucking electrode, followed by screen printing one or more main resistive heaters on a bottom of the ceramic body to form a single or multiple heating zones, firing the ceramic body having the main resistive heaters disposed thereon. After firing, the main resistive heaters are trimmed, for example by using a laser, to tune the resistance of the heaters. After trimming, the center of the ceramic body is machined to prepare the center for electrode brazing. The insulating layer is disposed over the trimmed heaters and is fired. Subsequently, the shaft is bonded using AlN containing tape or glass bonding tape to the ceramic body of the ESC. The AlN containing tape or glass bonding tape may form the insulating layer. The insulating layer may be bonded over the heaters simultaneously to the shaft being attached. After attachment of the shaft, the terminals of the high voltage chucking electrode are brazed inside shaft.

Alternatively or in addition to the sequence described above, the main resistive heaters may be trimmed after the shaft is bonded to the ceramic body of the ESC. The substrate support assembly 500 is heat treated to produce the desired breakdown voltage.

Figure 6:
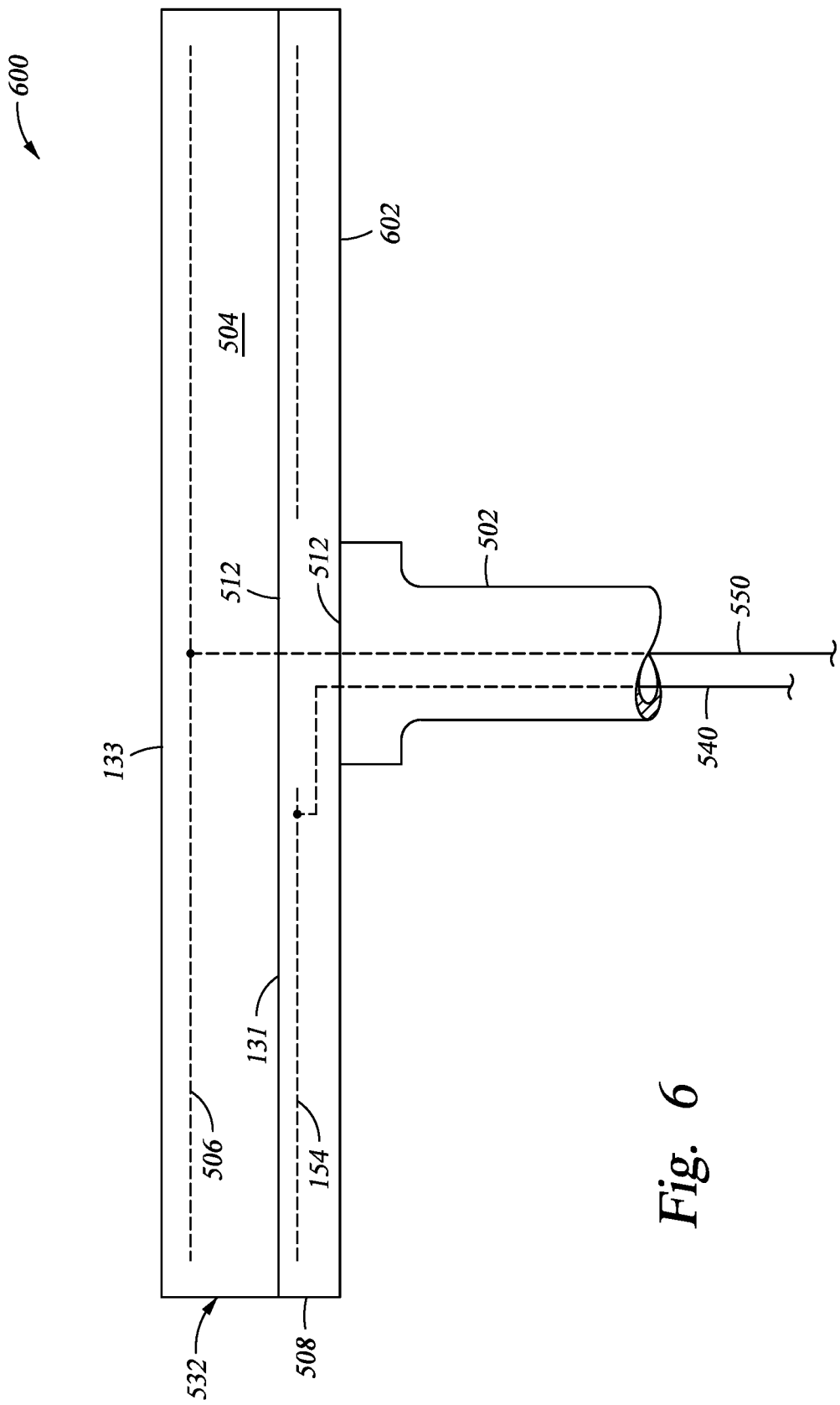
FIG. 6 is a partial cross-sectional schematic side view of yet another example of a substrate support assembly.

FIG. 6 is a partial cross-sectional schematic side view of another example of a substrate support assembly 600. The substrate support assembly 600 is essentially the same as the substrate support assembly 500 described above, except wherein the insulating coating 508 extends between the mounting surface 131 of the ceramic body 504 and the end 512 of the shaft 502 such that the shaft 502 is secured to a lower exposed surface 602 of the insulating coating 508.

Advantageously, the substrate support as described above is to be able to tune temperatures in one or more zones to provide the temperature uniformity capable to tune the etch rate. Additionally, ESC chucking allows for various backside pressure set points independent of the chamber pressure to better tune temperature control across the wafer. This enables etch amount radial tuning center to edge across the wafer adding capability to tune yield and chamber performance.

While the foregoing is directed to implementations of the present invention, other and further implementations of the invention may be devised without departing from the basic scope thereof, and the scope thereof is determined by the claims that follow.

We claim:

1. A substrate support assembly, comprising:
   an electrostatic chuck having a chuck body made from ceramic, the chuck body having a workpiece support surface and a bonding chuck body surface, the workpiece support surface and the bonding chuck body surface having a flatness of less than about 10 microns;
   a cooling base having a cooling body made from a metal or composite, the cooling body of the cooling base having an upper cooling body surface facing the bonding chuck body and a lower cooling body surface, wherein the upper cooling body surface has a flatness of less than about 10 microns;
   a plurality of heaters arranged in at least 4 separate zones and disposed in contact with the bonding chuck body surface outside the chuck body:
   a first heater of the plurality of heaters, wherein a first portion of the first heater has a trimmed smaller sectional area and a higher resistance relative to an adjacent second portion of the first heater, wherein the first portion and the second portion are arranged in series along a single electrically continuous path; and
   a bonding layer disposed over the first heater and the bonding chuck body surface and in contact with the cooling base, wherein the bonding layer is electrically insulating the first heater from the cooling base.

2. The substrate support assembly of claim 1, further comprising:
   a base plate disposed below the cooling base; and
   an edge ring circumscribing the electrostatic chuck, the cooling base and the base plate, wherein the edge ring is configured to channel a purge gas to the workpiece support surface.

3. The substrate support assembly of claim 1, wherein the bond layer has a thickness of between about 0.3 mm and about 2.0 mm and a thermal conductivity of between about 1.0 W/m-K and about 3.0 W/m-K.

4. The substrate support assembly of claim 3, wherein a variation of the thickness of the bond layer therebetween the electrostatic chuck and cooling base is less than 20 microns.

5. The substrate support assembly of claim 1, further comprising:
   a seal disposed between the electrostatic chuck and the cooling base.

6. A substrate support assembly, comprising:
   an electrostatic chuck having a chuck body made from ceramic, the chuck body having an embedded high voltage chucking electrode; the chuck body having a workpiece support surface and a bonding chuck body surface, the workpiece support surface and the bonding chuck body surface having a flatness of less than about 10 microns;
   a plurality of heaters arranged in at least 4 separate zones and disposed in contact with the bonding chuck body surface outside the chuck body:
   a first heater of the plurality of heaters disposed in contact with the bonding chuck body surface outside the chuck body, a first portion of the first heater having a trimmed smaller sectional area and a higher resistance relative to an adjacent second portion portions of the first heater to provide a desired temperature output, wherein the first portion and the second portion are arranged in series along a single electrically continuous path;
   a cooling base;
   an insulating layer disposed over the first heater and the bonding chuck body surface and in contact with the cooling base, wherein the insulating layer electrically insulates the first heater from the cooling base, wherein the insulating layer is a bonding layer; and
   a ceramic shaft having leads connected to the heater and to the chucking electrode embedded in the electrostatic chuck.

7. The substrate support assembly of claim 6, wherein the ceramic shaft is bonded to the electrostatic chuck.

8. The substrate support assembly of claim 6, wherein the ceramic shaft is bonded to the insulating layer disposed over the first heater.

9. The substrate support assembly of claim 6, wherein the insulating layer comprises one of a layer of ceramic, ceramic tape, and glass tape.

10. A processing chamber comprising:
    a chamber body having walls, a bottom and a lid which enclose an internal volume; and
    a substrate support assembly disposed in the internal volume, the substrate support assembly comprising:
    an electrostatic chuck having a chuck body made from ceramic, the chuck body having a workpiece support surface and a bonding chuck body surface, the workpiece support surface and the bonding chuck body surface having a flatness of less than 10 microns;
    a cooling base having a cooling body made from a metal, the cooling body of the cooling base having an upper cooling body surface and a lower cooling body surface wherein the upper cooling body surface is less than about 10 microns flat;

a plurality of heaters arranged in at least 4 separate zones and disposed in contact with the bonding chuck body surface outside the chuck body:
a first heater of the plurality of heaters disposed in direct contact with the bonding chuck body surface outside the chuck body, wherein a first portion of the first heater has a trimmed smaller sectional area and a higher resistance relative to adjacent second portion of the first heater, wherein the first portion and the second portion are arranged in series along a single electrically continuous path; and
a bonding layer disposed over the first heater and the bonding chuck body surface and in contact with the cooling base, wherein the bonding layer is electrically insulating the first heater from the cooling base.

11. The substrate support assembly of claim 10, further comprising:
a baseplate disposed below the cooling base; and
an edge ring circumscribing the electrostatic chuck, the cooling base and the base plate, wherein the edge ring is configured to channel a purge gas to the workpiece support surface and wherein the heaters are arranged in a plurality of zones.

12. The substrate support assembly of claim 10, wherein the bond layer has a thickness of between about 0.3 mm and about 2.0 mm, the thickness having a variation of less than about 20 micron, and the bond layer having a thermal conductivity of between about 1.0 W/m-K and about 3.0 W/m-K.

* * * * *